(12) United States Patent
Kuo et al.

(10) Patent No.: US 8,089,089 B2
(45) Date of Patent: Jan. 3, 2012

(54) SIDE-EMITTING LED PACKAGE AND MANUFACTURING METHOD OF THE SAME

(75) Inventors: Chester Kuo, Taipei Hsien (TW); Hsing-Fen Lo, Taipei Hsien (TW); Pin-Chuan Chen, Taipei Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 223 days.

(21) Appl. No.: 12/702,326

(22) Filed: Feb. 9, 2010

(65) Prior Publication Data
US 2010/0213487 A1    Aug. 26, 2010

(30) Foreign Application Priority Data
Feb. 24, 2009   (TW) .............................. 98105740 A

(51) Int. Cl.
*H01L 33/00*    (2010.01)
(52) U.S. Cl. ........... 257/98; 257/E33.068; 257/E21.502; 438/27
(58) Field of Classification Search .................... 257/98, 257/E33.068, E21.502; 438/27
See application file for complete search history.

(56) References Cited

U.S. PATENT DOCUMENTS

| | | | | |
|---|---|---|---|---|
| 5,959,316 | A * | 9/1999 | Lowery | 257/98 |
| 6,734,465 | B1 * | 5/2004 | Taskar et al. | 257/80 |
| 6,791,116 | B2 * | 9/2004 | Takahashi et al. | 257/79 |
| 7,153,000 | B2 * | 12/2006 | Park et al. | 362/268 |
| 7,157,745 | B2 * | 1/2007 | Blonder et al. | 257/98 |
| 7,282,748 | B2 * | 10/2007 | Takeda et al. | 257/98 |
| 7,371,593 | B2 * | 5/2008 | Harada | 438/26 |
| 7,442,563 | B2 * | 10/2008 | Harada | 438/26 |
| 7,745,985 | B2 * | 6/2010 | Tanimoto et al. | 313/501 |
| 7,754,527 | B2 * | 7/2010 | Ueno | 438/106 |
| 7,777,235 | B2 * | 8/2010 | Mazzochette et al. | 257/81 |
| 7,808,004 | B2 * | 10/2010 | Sun et al. | 257/79 |
| 7,834,854 | B2 * | 11/2010 | Kim | 345/170 |
| 7,839,087 | B2 * | 11/2010 | Takasu et al. | 313/512 |
| 7,842,960 | B2 * | 11/2010 | Reginelli et al. | 257/98 |
| 2003/0128341 | A1 * | 7/2003 | Li | 353/53 |
| 2004/0069993 | A1 * | 4/2004 | Murano | 257/79 |
| 2004/0232825 | A1 * | 11/2004 | Sorg | 313/501 |
| 2005/0167682 | A1 * | 8/2005 | Fukasawa | 257/79 |
| 2005/0224829 | A1 * | 10/2005 | Negley et al. | 257/99 |
| 2006/0186431 | A1 * | 8/2006 | Miki et al. | 257/100 |
| 2007/0018123 | A1 * | 1/2007 | Sano | 250/551 |
| 2007/0215998 | A1 * | 9/2007 | Hu et al. | 257/678 |

(Continued)

FOREIGN PATENT DOCUMENTS

CN    1366715 A    8/2002

(Continued)

*Primary Examiner* — N Drew Richards
*Assistant Examiner* — Ankush Singal
(74) *Attorney, Agent, or Firm* — Altis Law Group, Inc.

(57) ABSTRACT

A side-emitting LED includes a substrate formed with a plurality of electrodes, an LED chip bonded onto the substrate and electrically connected to the electrodes, a transparent member encapsulating the LED chip and a casing fixed on the substrate. The transparent member has a flat bottom surface attached to the substrate, a vertically surface extending perpendicularly from a straight side edge of the flat bottom surface and a curved surface connected to curved edges of the flat bottom and vertical surfaces. The casing encapsulates the transparent member excepting the vertical surface of the transparent member. The curved surface of the transparent member is shaped as a part of an outer surface of an ellipsoid.

20 Claims, 14 Drawing Sheets

U.S. PATENT DOCUMENTS

| | | | |
|---|---|---|---|
| 2007/0221934 A1* | 9/2007 | Inoue | 257/98 |
| 2008/0165539 A1* | 7/2008 | Hsu et al. | 362/309 |
| 2008/0231181 A1* | 9/2008 | Pang | 313/512 |
| 2008/0303410 A1* | 12/2008 | Kaneda et al. | 313/503 |
| 2008/0303411 A1* | 12/2008 | Ohta et al. | 313/503 |
| 2009/0015137 A1* | 1/2009 | Su et al. | 313/503 |
| 2009/0020773 A1* | 1/2009 | Nomura et al. | 257/98 |
| 2009/0121249 A1* | 5/2009 | Tseng et al. | 257/98 |
| 2009/0140271 A1* | 6/2009 | Sah | 257/88 |
| 2009/0206353 A1* | 8/2009 | Okazaki | 257/98 |
| 2010/0171445 A1* | 7/2010 | Ku | 315/314 |
| 2010/0213861 A1* | 8/2010 | Kaneda et al. | 315/250 |
| 2010/0230691 A1* | 9/2010 | Inoue et al. | 257/98 |
| 2010/0328925 A1* | 12/2010 | Hoelen et al. | 362/84 |
| 2011/0006334 A1* | 1/2011 | Ishii et al. | 257/98 |

FOREIGN PATENT DOCUMENTS

TW          M339080          8/2008

\* cited by examiner

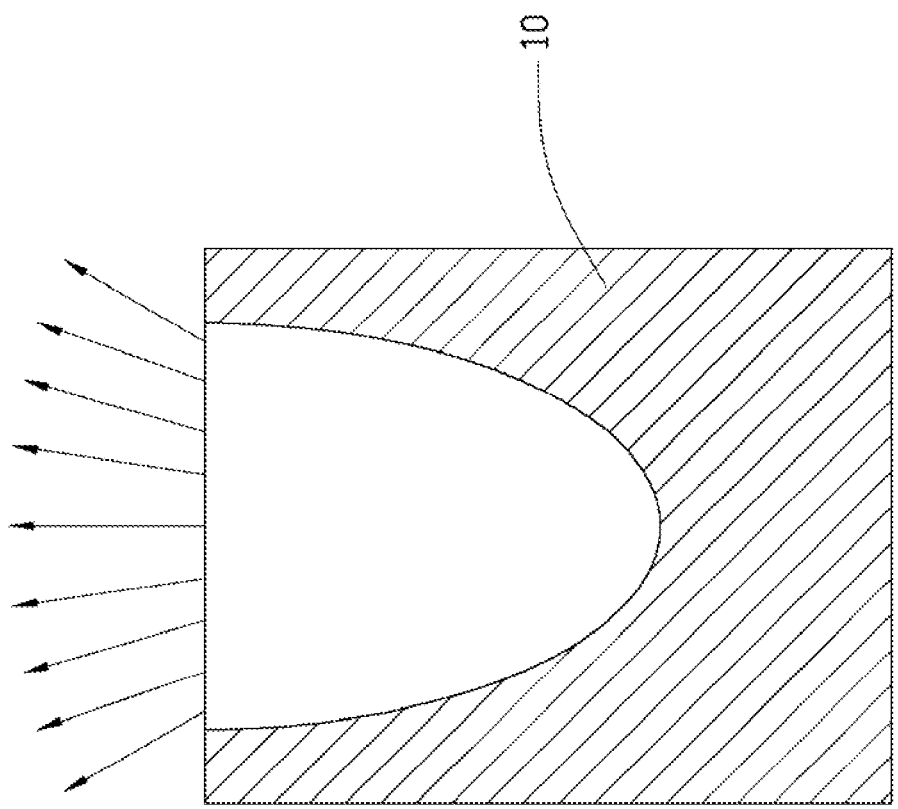

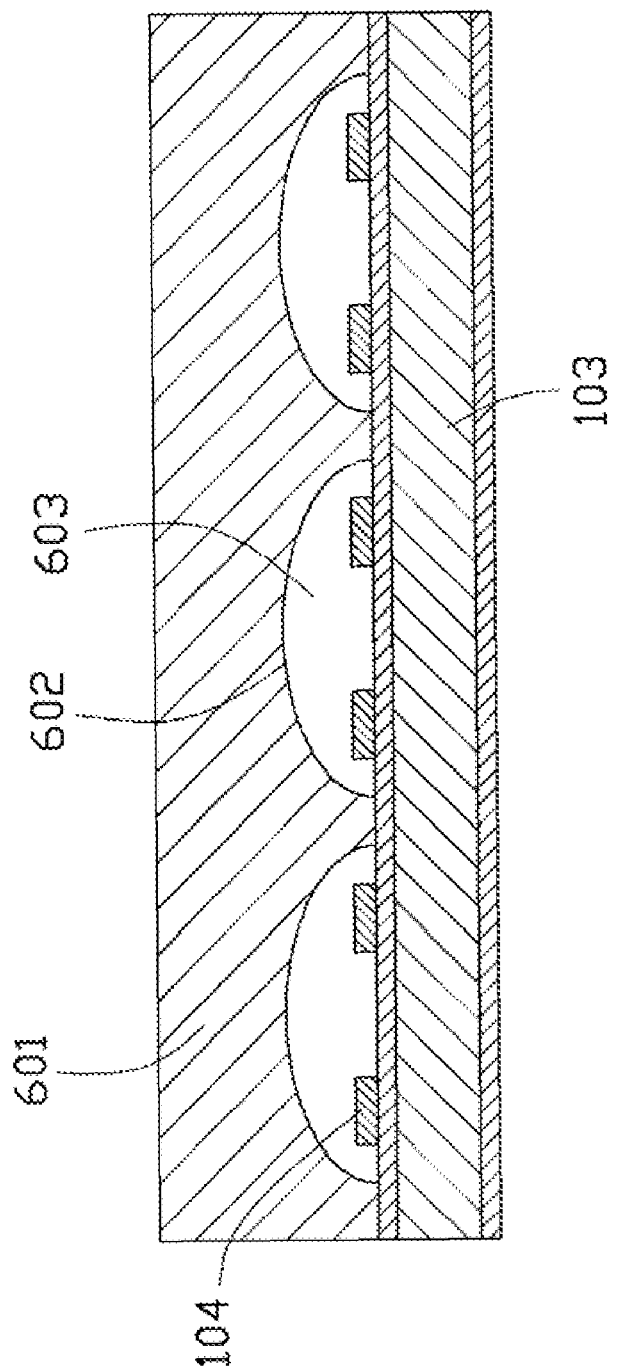

SIDE-EMITTING LED PACKAGE AND MANUFACTURING METHOD OF THE SAME

BACKGROUND

1. Technical Field

The present disclosure relates to a side-emitting LED package and a manufacturing method of the same, wherein the side-emitting LED package can be manufactured in a high speed and low cost.

2. Description of Related Art

In conventional technology, a side-emitting LED package is manufactured by placing an LED chip on a substrate which is covered by a casing or a molded body having a cavity therein bonded to the substrate. A transparent resin is injected and cured in the cavity, and diced afterwards. The cavity accommodating the chip is defined in the casing and has an opening in a side of the casing to expose the chip sideward. This conventional method, however, entails a complicated process, and thus is not efficient in terms of productivity.

Further, for facility of forming the casing or the molded body, the casing or molded body usually has straight inner sidewalls on which a reflective layer is formed to prevent light from leaking. The reflective layer, however, can not redirect the light generated by the chip to transmit through the opening of the cavity efficiently, due to the undesirable configuration of the straight inner sidewalls on which the reflective layer is arranged.

What is need, therefore, is a side-emitting LED package and a manufacturing method of the same which can overcome the above disadvantages.

BRIEF DESCRIPTION OF THE DRAWINGS

FIG. 3b is an another schematic view showing light transmitted to one side of the LED package of FIG. 1.

FIG. 6b is an illustrative, sectional view of the substrate together with the first mold, showing a step of mounting the first mold onto the substrate.

DETAILED DESCRIPTION

Exemplary embodiments of the present disclosure will now be described in detail with reference to the accompanying drawings.

Figure 1:
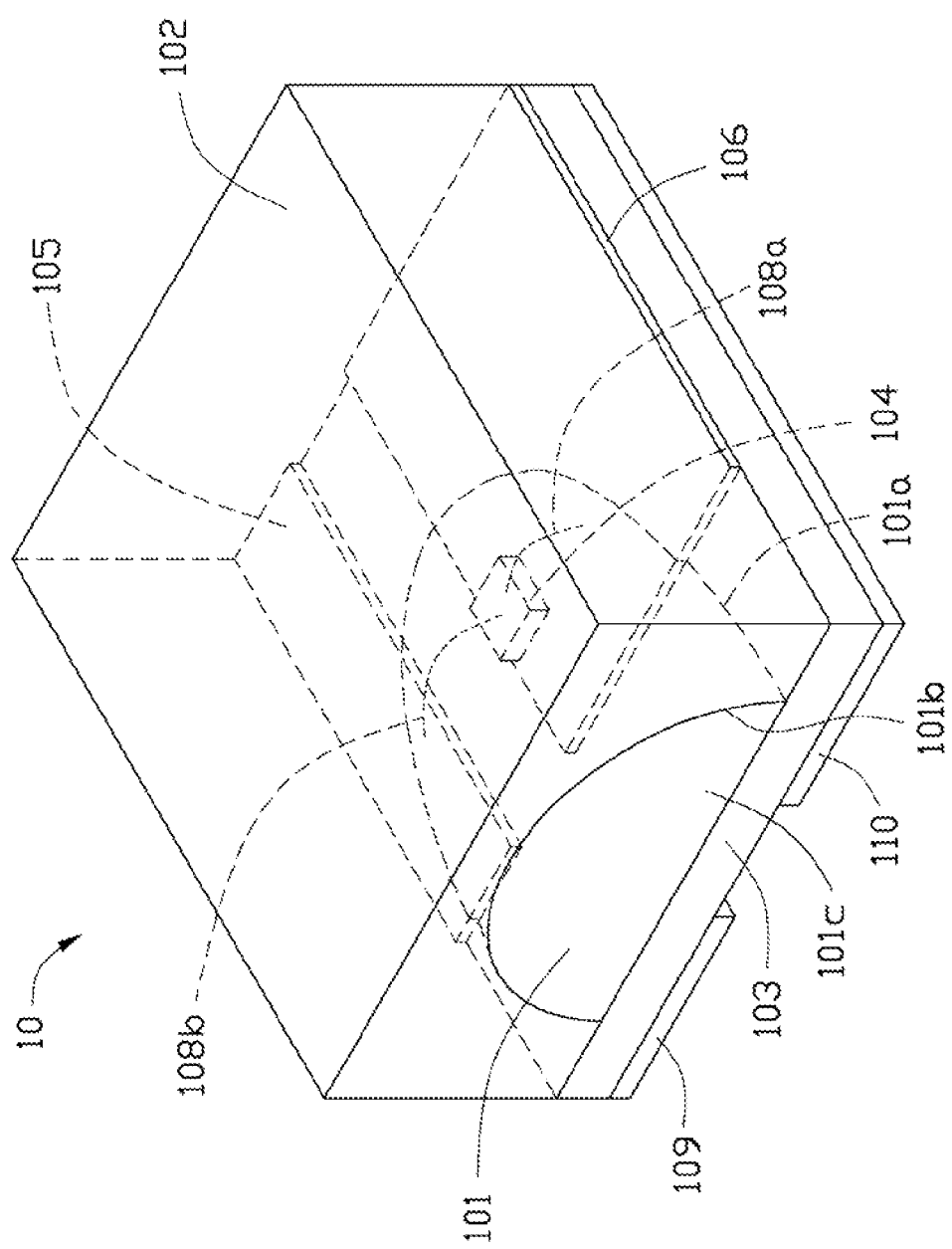
FIG. 1 is an isometric view of a side-emitting LED package in accordance with a first embodiment of the disclosure.
Figure 2:
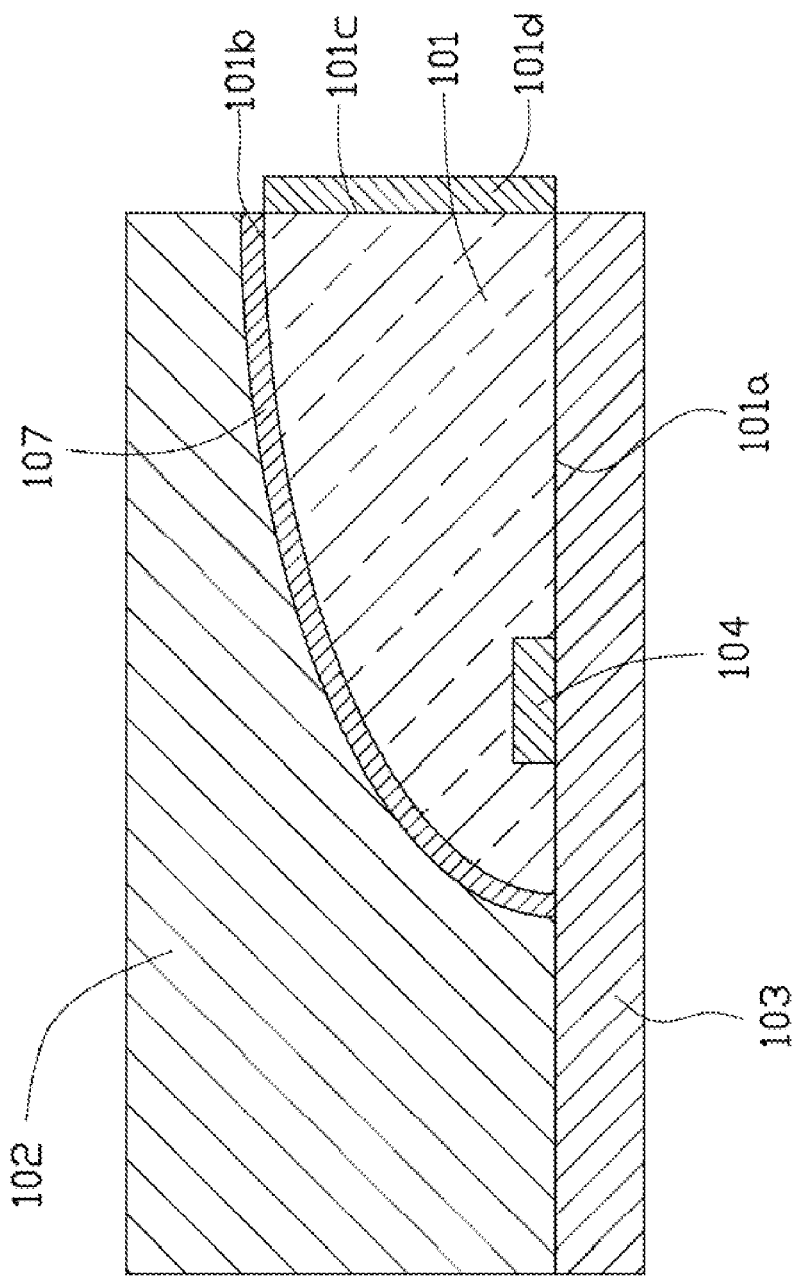
FIG. 2 is a cross-sectional view of the LED package of FIG. 1.

Referring to FIGS. 1 and 2, a side-emitting LED package 10 (hereafter referred merely to as "LED package 10") according to an embodiment of the present disclosure is designed to emit light from a light source such as an LED chip 104 to one lateral side of the LED package 10. The direction of light emission is preferably parallel to a plane where the LED chip 104 is mounted.

The LED package 10 comprises an insulating substrate 103 (hereafter referred merely to as "substrate 103") on which the LED chip 104 is placed, a transparent member 101 fixed on the substrate 103 and encapsulating the LED die 104. An opaque casing 102 (hereafter referred merely to as "casing 102") covers both the transparent member 102 and a first surface of the substrate 103 on which the LED chip 104 is placed.

The substrate 103 is preferably a metal core printed circuit board (MCPCB), a ceramic substrate or a thin substrate. The thin substrate has been recorded in Taiwanese Patent Application No. 096126300 which is filed by Advanced Optoelectronic Technology, INC. and U.S. patent application Ser. No. 12/173,763 which is filed by Advanced Optoelectronic Technology, INC. The thin substrate has two kinds of structures, one kind of structure is that, an external electrode directly bares an encapsulant, there is no need that a printed circuit board is sandwiched between an chip and the external electrode to transfer electrical signals. In manufacturing process of this kind of structure, the chip and bonding wires are connected to a temporary printed circuit board, and then the encapsulant is injected at a surface of the temporary printed circuit board and fixes the chip, the bonding wires and the external electrode together. The temporary printed circuit board is removed from the encapsulant in order to bare the external electrode out of the encapsulant, thereby reducing encapsulation volume. Another kind of the structure is a compound substrate. The compound substrate comprises a first conducting layer, an insulating film having multiple holes and a second conducting layer. Via this structure, the chip becomes thin to save space occupation thereof. By applying the two kinds of thin substrate structures, a thickness of the encapsulation is controlled within 0.2-0.3 mm, saving space occupation of the chip and improving heat dissipation efficiency. The substrate 103 is provided with four electrodes including a first electrode 105, a second electrode 106, a third electrode 109 and a fourth electrode 110. The first and second electrodes 105, 106 separated apart from each other are mounted on the first surface of the substrate 103, while the third and fourth electrodes 109, 110 separated apart from each other are mounted on a second surface of the substrate 103 opposite to the first surface. The first electrode 105 is located right over the third electrode 109 and electrically connected to the third electrode 109. The second and fourth electrodes 106, 110 are structured in the same or similar manner and electrically connected to each other. The LED chip 104 is die-bonded onto the second electrode 106 and electrically connected to the first and second electrodes 105, 106 by bonding wires 108b, 108a, respectively. That is, the P electrode of the LED chip 104 is electrically connected to the first and third electrodes 105, 109 by the bonding wire 108b, while the N electrode of the LED chip 104 is electrically connected to the second and fourth electrodes 106, 110 by the bonding wire 108a.

The transparent member 101 is formed of transparent resin mixed with fluorescent material which is for changing wave length of part of light transmitted therethrough to mix with other part of the light to obtain white light. In one embodiment, the fluorescent material lengthens wave length of a part of blue light emitted by the LED chip 104 to mix with other part of the blue light to obtain white light. The transparent member 101 is adhered to the first surface of the substrate 103 and encapsulates the LED die 104 and the bonding wires 108a, 108b therein. The transparent member 101 has a configuration of a quarter of an ellipsoid. The transparent member 101 consists of a flat bottom surface 101a attached to the first surface of the substrate 103, a vertical surface 101c extending upwardly and perpendicularly from a straight side edge of the flat bottom surface and a curved surface 101b connected to curved edges of the flat bottom and vertical surfaces 101a, 101c. The curved surface 101b of the transparent member 101 is actually a quarter of an outer surface of an ellipsoid.

The casing 102 is cuboid-shaped in profile and encapsulates the transparent member 101, excepting the vertical surface 101c of the transparent member 101 which is exposed to a left side of the casing 102 of the LED package 10. The casing 102 has an inner surface having a configuration in complementary with the curved surface 101b of the transparent member 101 and wholly wrapping the curved surface 101b. A reflective layer 107 is provided between the inner surface of the casing 102 and the curved surface 101b of the transparent member 101 and wholly wraps the curved surface 101b to reflect light generated by the LED chip 104 to transmit through the vertical surface 101c of the transparent member 101. That is, the vertical surface 101c of the transparent member 101 is coplanar with the left side of the casing 102 and functions as a light transmitting face of the LED package 10. The vertical surface (light exiting transmitting face) 101c forms a right angle with a planar surface of the substrate 103 where the LED chip 104 forming the light source is mounted. To enhance a uniformity of white light emitted outside of the LED package 10, a layer of phosphor 101d is preferably coated on the vertical surface 101c of the transparent member 101.

Figure 3A:
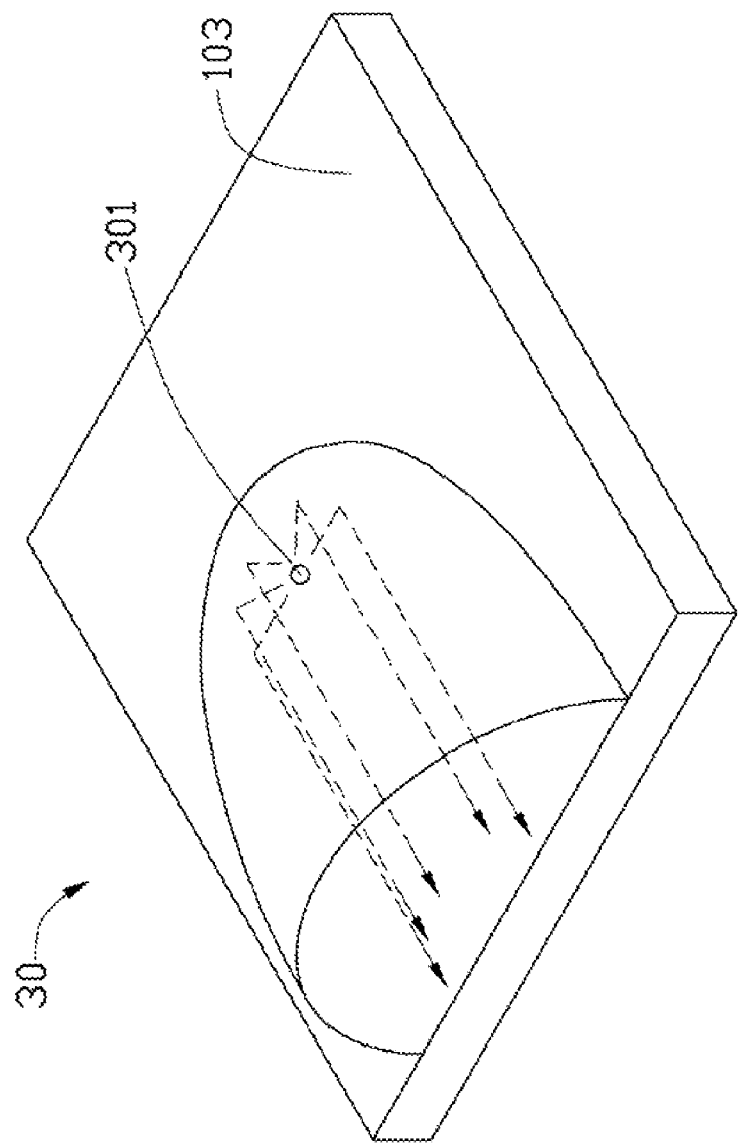
FIG. 3a is a schematic view showing light transmitted to one side of the LED package of FIG. 1.

Also referring to FIGS. 3a and 3b, in use of the LED package 10, the reflective layer 107 coated on an outer surface of ellipsoid body 30 is constructed to have a focus 301 where light directed to the reflective layer 107 along a direction parallel to the first surface of the substrate 103 is concentrated, by adapting the curved surface 101b and the transparent member 101 correspondingly into a specific configuration. The LED chip 104 is placed exactly at the focus 301; therefore, most light generated by the LED chip 104 is reflected to transmit through the vertical surface 101c of the transparent member 101 in a single direction parallel to the first surface of the substrate 103 (perpendicular to the vertical surface 101c). The curved surface 101b actually has a configuration similar to a part of an outer surface of the ellipsoid. The curved surface 101b includes a plurality of curved sections and a plurality of planar sections parallel to the substrate 103 or the vertical surface 101c of the transparent member 101. The curved sections and planar sections of the curved surface 101b cooperatively reflect light from the LED chip 104 to one side of the LED package 10 to form an illumination with a desired area and intensity. Thus, the LED package 10 with the curved surface 101b is able to emit light from the LED chip efficiently to the left side thereof.

A manufacturing method of the side-emitting LED package 10 according to a preferred embodiment will be explained in detail accompanying FIG. 4.

Figure 4:
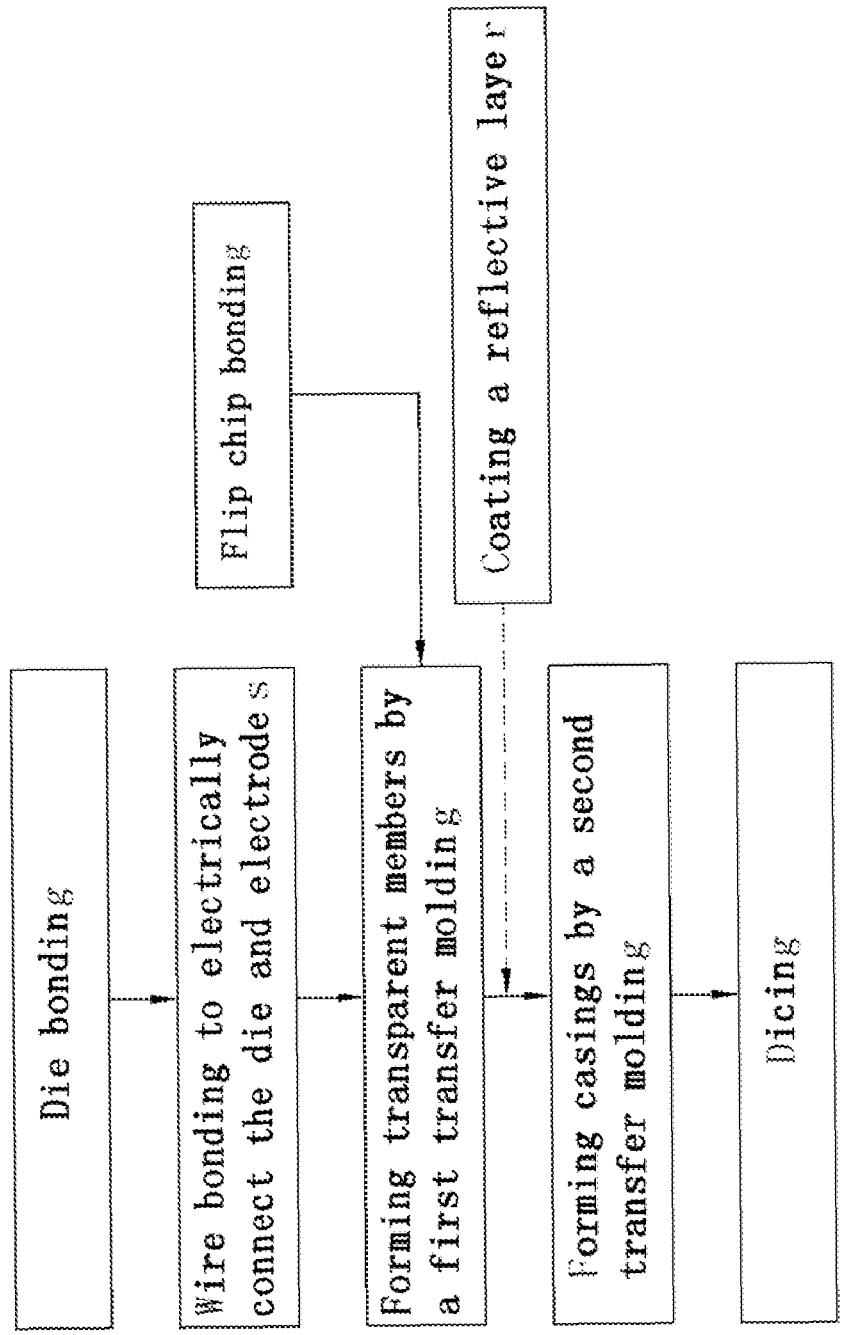
FIG. 4 is a flow chart showing steps of manufacturing the LED package of FIG. 1.
Figure 5:
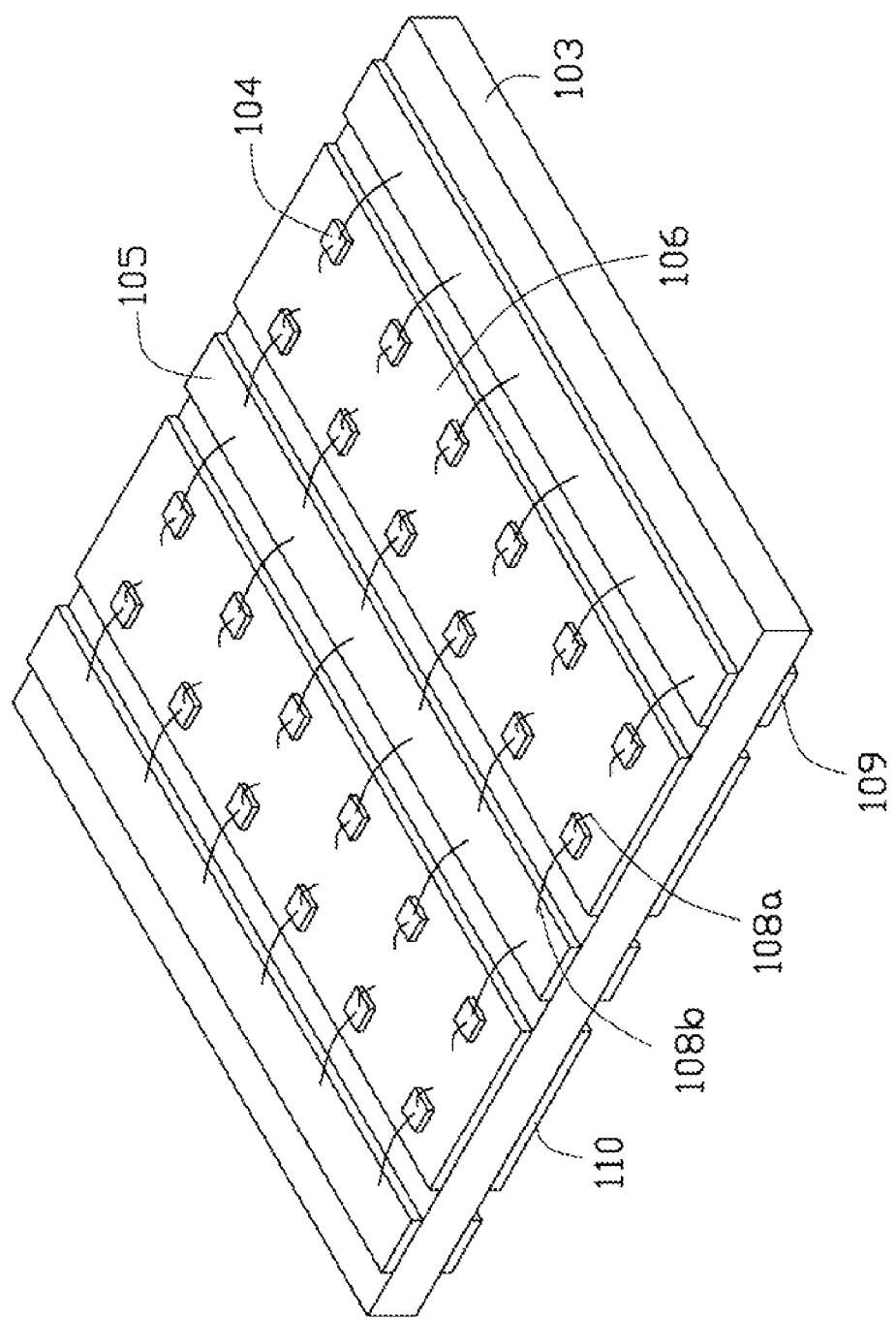
FIG. 5 is an illustrative view showing a step of bonding LED chips on a substrate.

As shown in FIGS. 4 and 5, the manufacturing method of the side-emitting LED package 10 starts with a step of providing a single substrate 103 with a plurality of first electrodes 105, a plurality of second electrodes 106, a plurality of third electrodes 109 and a plurality of fourth electrodes 110 formed thereon. The first electrodes 105 are located right over the third electrodes 109 and electrically connected to the third electrodes 109, respectively. The second and fourth electrodes 106, 110 are structured in the same or similar manner and electrically connected to each other, respectively.

In the next step, a plurality of LED chips 104 are disposed on the substrate 103 in a matrix arrangement. Each LED chip 104 is mounted on a second electrode 106 by wire bonding or solder dipping method, and the LED chip 104 is further electrically connected to the first and second electrodes 105, 106 correspondingly, by bonding wires 108a, 108b, respectively. That is, the P electrode of the LED chip 104 is electrically connected to the first and third electrodes 105, 109 by the bonding wire 108b, while the N electrode of the LED chip 104 is electrically connected to the second and fourth electrodes 106, 110 by the bonding wire 108a. The electrodes 105, 106, 109, 110 are preferably made of copper. In other embodiments of the present disclosure, the LED chips 104 are formed directly on the second electrodes 106, respectively, by flip chip bonding.

Figure 6A:
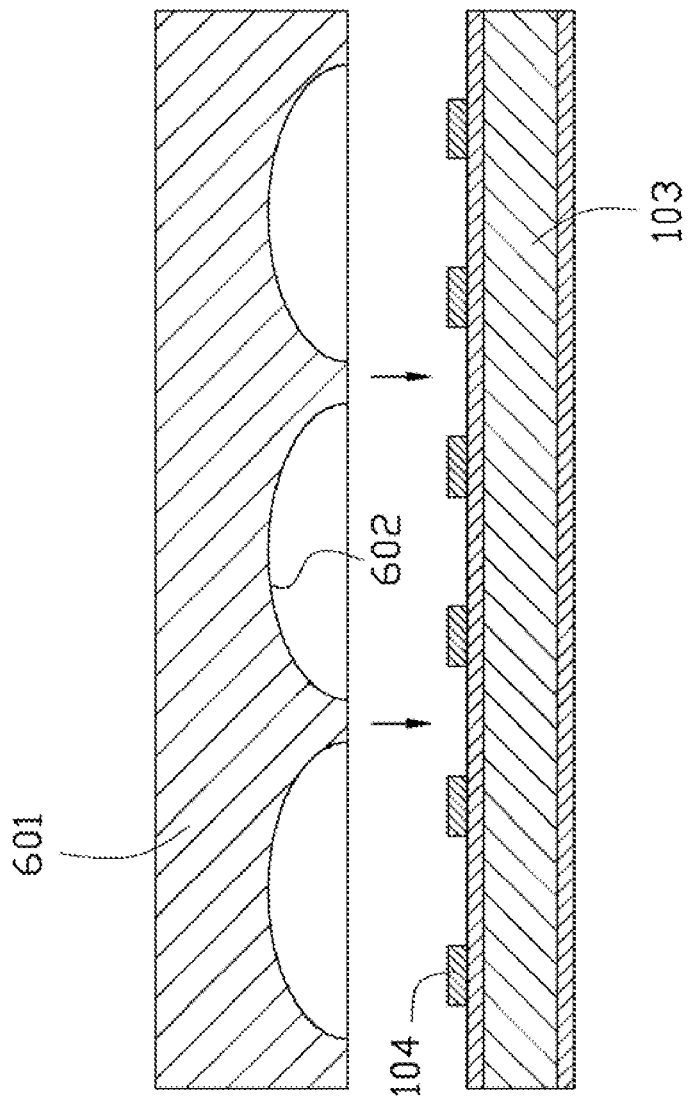
FIG. 6a is an illustrative, sectional view of the substrate together with a first mold, showing a step of prior to mounting the first mold onto the substrate.
Figure 7:
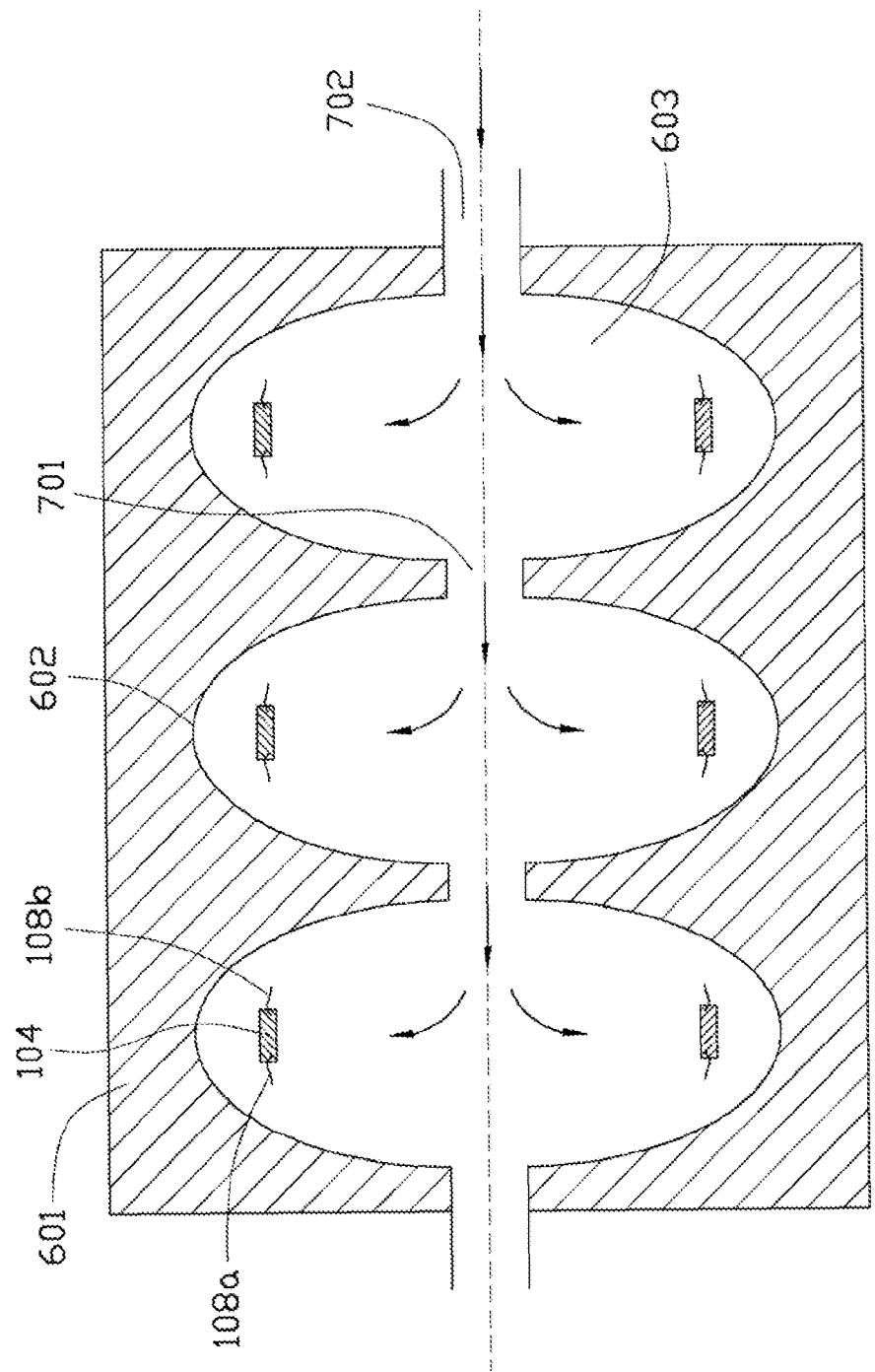
FIG. 7 is an illustrative view showing a step of injecting a transparent resin into the first mold.

Referring to FIGS. 6a and 6b, in the next step, a first mold 601 with a plurality of oval cavities 602 formed in a bottom surface thereof is provided. Each oval cavity 602 defines a room 603 in a shape of a half of an ellipsoid. In this step, the first mold 601 is mounted on the substrate 103 with each oval cavity 602 located over two of the LED chips 104. The two LED chips 104 accommodated in one of the oval cavities 602 are exactly located at the two focuses of the half of the ellipsoid room 603 defined in the oval cavity 602. As shown in FIG. 7, a connecting channel 701 is defined between every two neighboring oval cavities 602 of the first mold 601 in a row to communicate the oval cavities 602 together. Two openings 702 communicating the oval cavities 602 and the connecting channels 701 are defined at two opposite sides of the first mold 601, for injection of transparent resin into the oval cavities 602.

Figure 8:
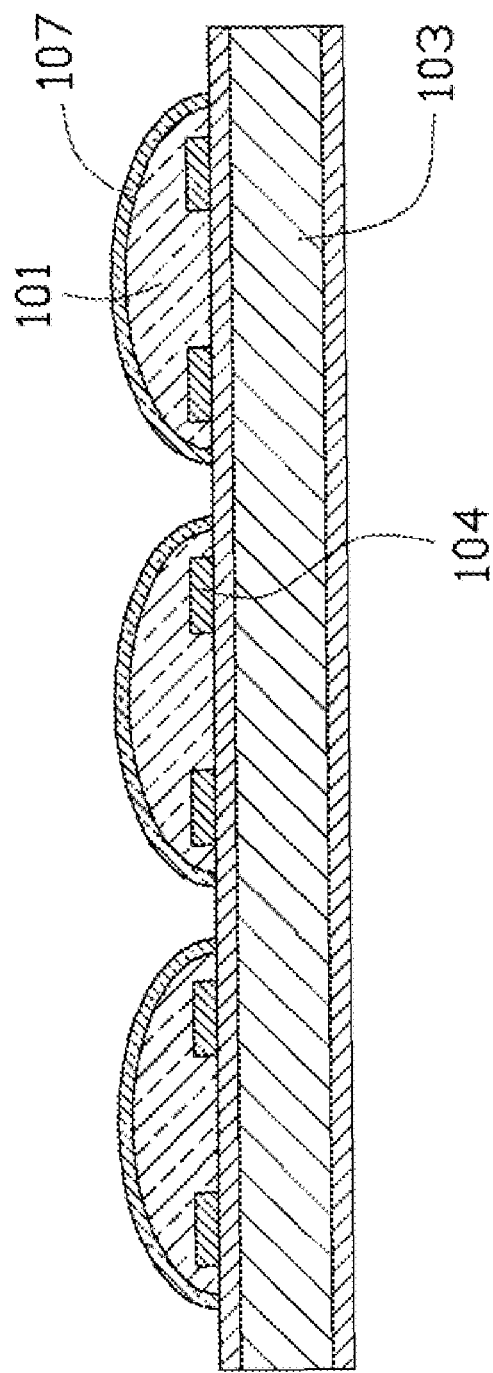
FIG. 8 is an illustrative, sectional view of the substrate together with transparent members, showing a step of coating the transparent members with reflective layers.

In the next step, a transparent resin preferably mixed with fluorescent material is injected into the first mold 601 from one of the openings 702, until the oval cavities 602 of the first mold 601 are fully filled with the transparent resin, as shown in FIG. 7. Thus, the transparent members 101 are thus formed by a first transferring molding using the first mold 601. The transparent resin is preferred to be epoxy or silicon resin. The fluorescent material is formed from a group comprising an element selected from sulfides, oxides, nitrides and silicate. As shown in FIG. 8, when the transparent resin is hardened and completed in a desired form of the transparent members 101 as described above, a reflective layer 107 is subjected to be coated on the curved surface 101b of each transparent member 101 after removing the first mold 601 away from the substrate 103. The reflective layers 107 can be formed on the curved surfaces 101b of the transparent members 101 by method of sputter, plastic plating or chemical plating. The reflective layers 107 can also be formed by depositing metal selected from group comprising Al, Au, Ag, Ni, W, Ti and Pt.

Figure 9A:
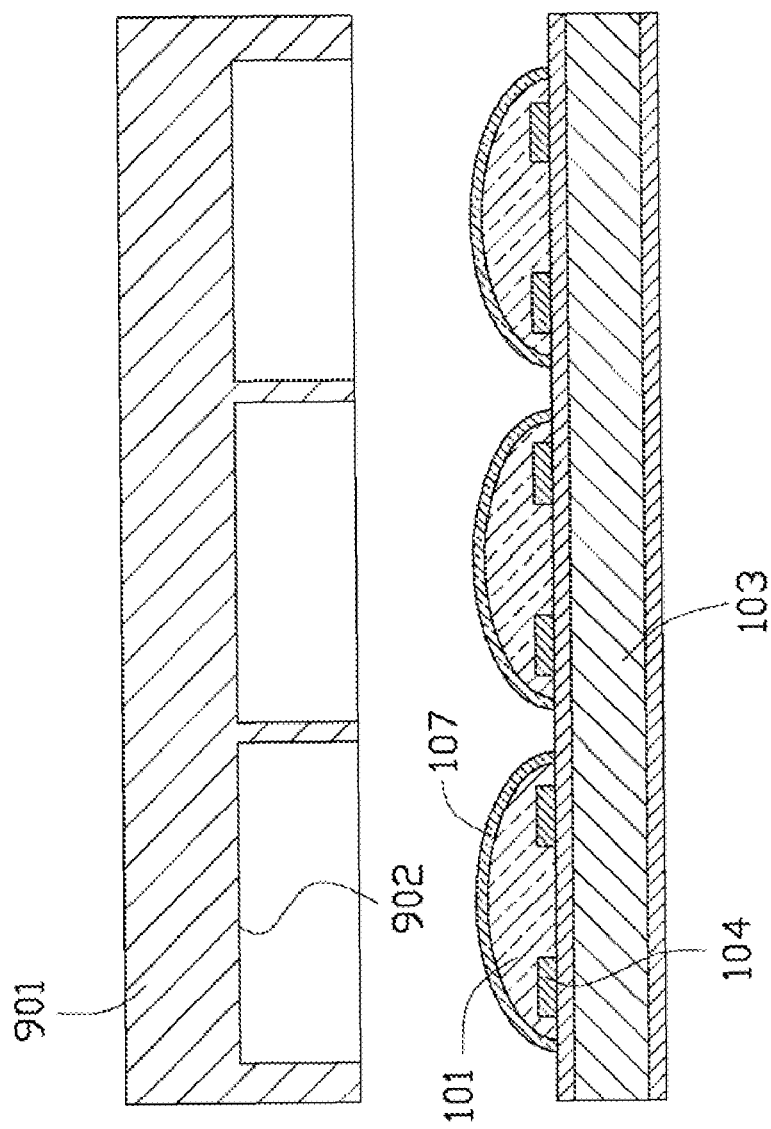
FIG. 9a is an illustrative, sectional view of the substrate together with a second mold, showing a step of prior to mounting a second mold onto the substrate.
Figure 9B:
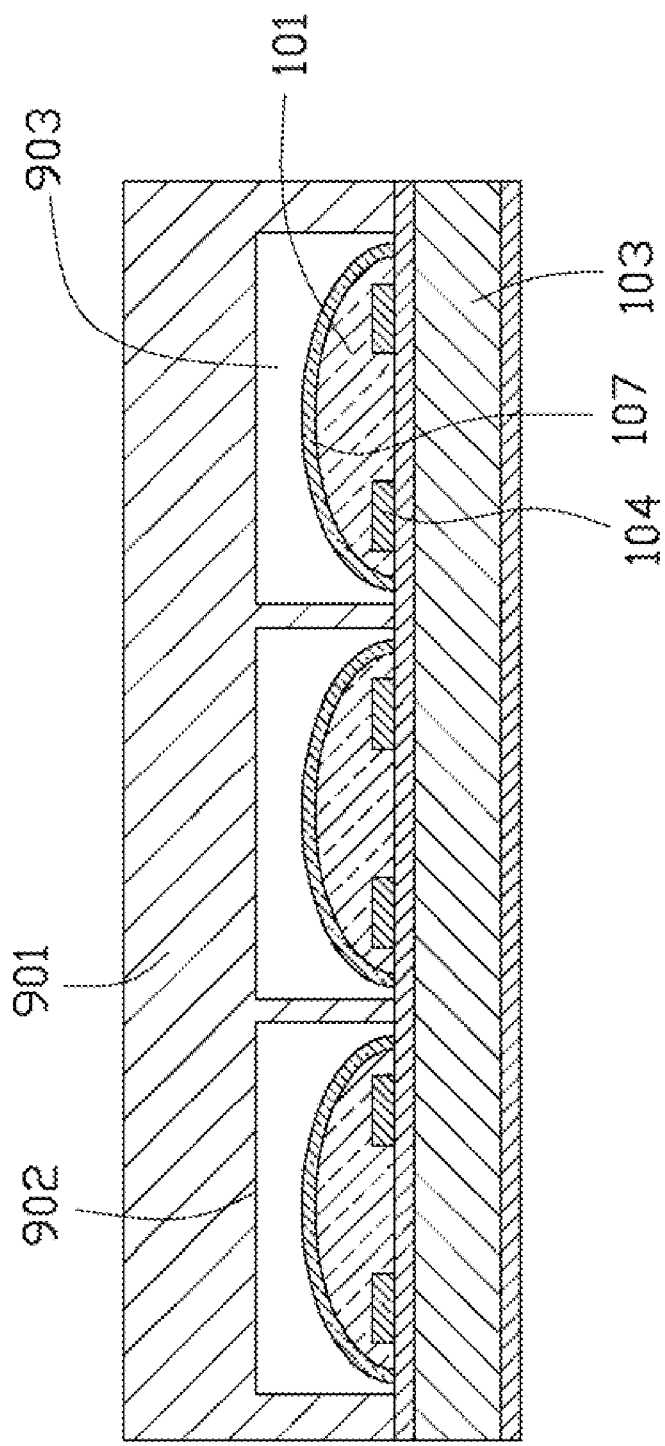
FIG. 9b is an illustrative, sectional view of the substrate together with the second mold, showing a step of mounting the second mold onto the substrate.

As shown in FIGS. 9a and 9b, a second mold 901 with a plurality of cuboid cavities 902 formed in a bottom surface thereof is provided. In this step, the second mold 901 is mounted on the substrate 103 with each cuboid cavity 902 located over a corresponding transparent member 101. That is, each cuboid cavity 902 defines a room 903 of cuboid shape therein and accommodates a corresponding transparent member 101. A connecting channel 10a is defined between every two neighboring cuboid cavities 902 of the second mold 901 in a row to communicate the two neighboring cuboid cavities 902 together. Two openings 10b communicating the cuboid cavities 902 and the connecting channels 10a are defined at two opposite sides of the second mold 901, for injection of molding material into the cuboid cavities 902.

Figure 10:
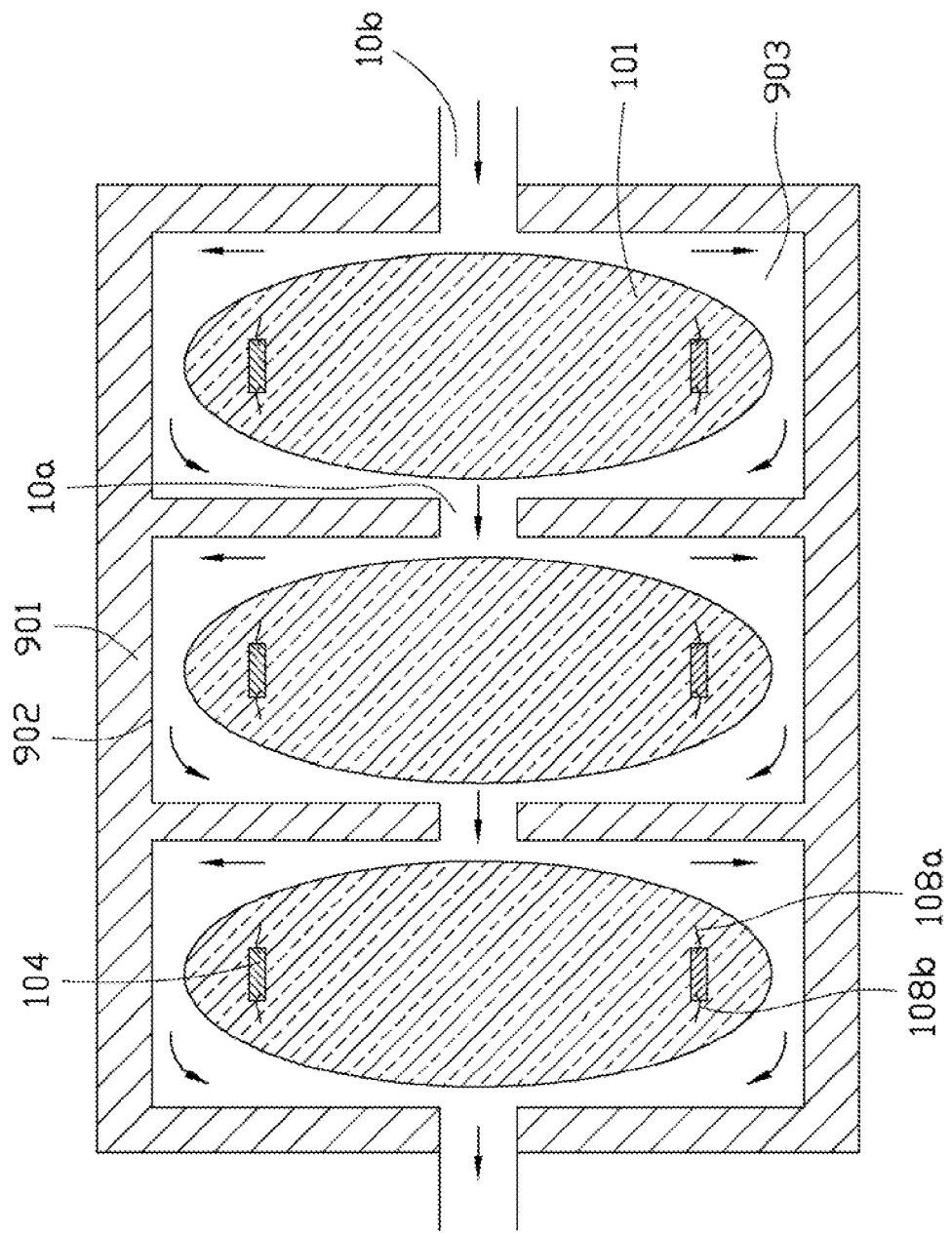
FIG. 10 is an illustrative view showing a step of injecting a molding material into the second mold.
Figure 11:
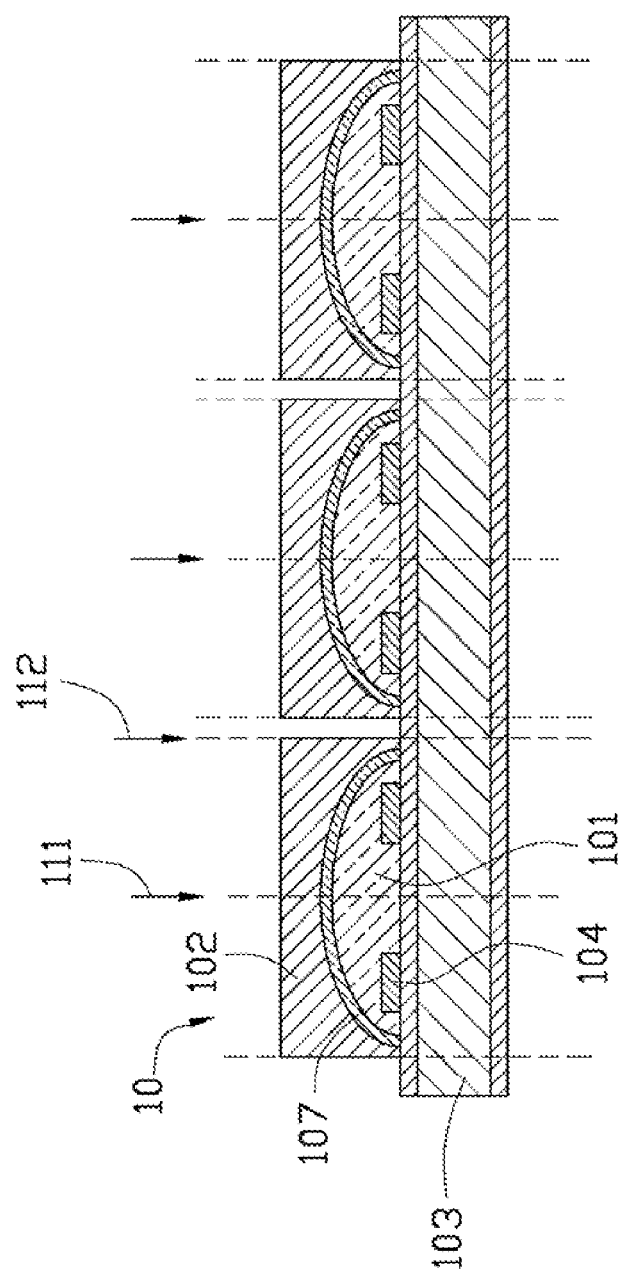
FIG. 11 is an illustrative view showing a step of dicing the substrate with transparent members and casings formed thereon.

In the next step, a molding material is injected into the second mold 901 from one of the openings 10b, until the cuboid cavities 902 of the second mold 901 are fully filled with the molding material, as shown in FIG. 10. Thus, the casings 102 are formed by a second transferring molding using the second mold 902. The molding material is formed of opaque material such as PPA (Polyphthalamide) or PPB. When the molding material is hardened and completed in a desired form of the casing 102 as described above, the second mold 901 is removed from the substrate 103. The substrate 103 together with the transparent members 101 and the casing 102 formed on the substrate 103 is subjected to be diced at a portion shown by dotted lines indicated by arrows 111 and 112 in FIG. 11, and a plurality of side-emitting LED packages 10 described above are thus obtained.

The above described manufacturing method manufactures the side-emitting LED package 10 directly by twice-molding, thus greatly reducing a cost and cycle time of the manufacturing and also simplify a process of the manufacturing.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A side-emitting LED package:
    a substrate formed with a plurality of electrodes;
    an LED chip bonded onto the substrate and electrically connected to the pluarity of electrodes;
    a transparent member encapsulating the LED chip and having a flat bottom surface attached to the substrate, a vertical surface extending perpendicularly from a straight side edge of the flat bottom surface and a curved surface connected to curved edges of the flat bottom and the vertical surface; and
    a casing fixed on the substrate and encapsulating the transparent member, excepting the vertical surface of the transparent member;
    wherein the curved surface of the transparent member is shaped as a part of an outer surface of an ellipsoid.

2. The side-emitting LED package of claim 1, wherein a reflective layer is formed between the casing and the transparent member.

3. The side-emitting LED package of claim 1, wherein the plurality of electrodes comprise a first electrode, a second electrode, a third electrode and a fourth electrode, the first and second electrodes separated apart from each other and mounted on a first surface of the substrate, while the third and fourth electrodes separated apart from each other and mounted on a second surface of the substrate opposite to the first surface.

4. The side-emitting LED package of claim 1, wherein the substrate is a metal core printed circuit board (MCPCB) or a ceramic substrate.

5. The side-emitting LED package of claim 1, wherein the transparent member is formed of transparent resin mixed with fluorescent material, and thus is capable of changing wave length of a part of single color light transmitted therethrough to mix with other part of the single color light to obtain white light.

6. The side-emitting LED package of claim 2, wherein the reflective layer wholly covers the curved surface of the transparent memeber and reflects light from the LED chip to transmit through the vertical surface in a direction parallel to a planer surface where the LED chip is mounted.

7. The side-emitting LED package of claim 3, wherein the first electrode is located over the third electrode and electrically connected to the third electrode, and the second electrode is located over the fourth electrode and electrically connected to the fourth electrode.

8. The side-emitting LED package of claim 7, wherein the LED chip is die-bonded onto the second electrode and electrically connected to the first and second electrodes by bonding wires, respectively.

9. The side-emitting LED package of claim 5, wherein the transparent resin comprises epoxy or silicon resin.

10. The side-emitting LED package of claim 5, wherein the fluorescent material is formed from a group comprising an element selected from sulfides, oxides, nitrides and silicate.

11. The side-emitting LED package of claim 5, wherein the casing is formed of PPA or PPB.

12. A manufacturing method of a side-emitting LED package, comprising following steps:
    (i) providing a substrate formed with a plural electrodes;
    (ii) bonding LED chips on the substrate;
    (iii) forming a transparent member encapsulating the LED chips, wherein the transparent member having a configuration of a half of an ellipsoid with a flat elliptical bottom surface attached to the substrate, the LED chips each being located at one of two focuses of the flat elliptical bottom surface;
    (iv) forming a casing on the substrate and encapsulating the transparent member;
    (v) dicing the substrate together with the transparent member and the casing into the side-emitting LED package each having a corresponding LED chip therein, wherein the transparent member is divided into two halves each having a bottom face, a vertical surface extending perpendicularly from a straight side edge of the bottom surface and a curved surface connected to curved edges of the bottom face and the vertical surface.

13. The manufacturing method of a side-emitting LED package of claim 12, wherein the transparent member is coated with a reflective layer between the casing and the transparent member after forming the transparent member in step (iii).

14. The manufacturing method of a side-emitting LED package of claim 12, wherein the transparent member (iii) is formed by transfer molding.

15. The manufacturing method of a side-emitting LED package of claim 12, wherein the casing is formed by transfer molding.

16. The manufacturing method of a side-emitting LED package claim 12, wherein the substrate is a metal core printed circuit board (MCPCB) or a ceramic substrate.

17. The manufacturing method of a side-emitting LED package of claim 12, wherein the transparent member is formed of transparent resin mixed with fluorescent material, and is capable of changing wave length of a part of single color light transmitted therethrough to mix with other part of the single color light to obtain white light.

18. The manufacturing method of a side-emitting LED package of claim 12, wherein the molding material is formed of PPA or PPB.

19. The manufacturing method of a side-emitting LED package of claim 13, wherein the reflective layer is formed by depositing metal selected from group comprising Al, Au, Ag, Ni, W, Ti and Pt.

20. The manufacturing method of a side-emitting LED package of claim 17, wherein the transparent resin comprises epoxy or silicon resin, the fluorescent material is formed from a group comprising an element selected from sulfides, oxides, nitrides and silicate.

* * * * *